United States Patent
Feng et al.

(10) Patent No.: US 7,811,904 B2
(45) Date of Patent: Oct. 12, 2010

(54) METHOD OF FABRICATING A SEMICONDUCTOR DEVICE EMPLOYING ELECTROLESS PLATING

(75) Inventors: Tao Feng, Santa Clara, CA (US); Ming Sun, Sunnyvale, CA (US); Yueh-Se Ho, Sunnyvale, CA (US); Kai Liu, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 33 days.

(21) Appl. No.: 11/701,561

(22) Filed: Jan. 31, 2007

(65) Prior Publication Data
US 2008/0182387 A1    Jul. 31, 2008

(51) Int. Cl.
*H01L 21/00* (2006.01)
(52) U.S. Cl. .................... 438/465; 438/459; 438/460; 257/E21.001
(58) Field of Classification Search ......... 438/459–465, 438/233, 781; 257/416, 618, E21.001
See application file for complete search history.

(56) References Cited

U.S. PATENT DOCUMENTS

| | | | |
|---|---|---|---|
| 6,544,902 B1 * | 4/2003 | Farnworth | 438/781 |
| 6,709,953 B2 * | 3/2004 | Vasquez et al. | 438/460 |
| 2003/0143818 A1 * | 7/2003 | Vasquez et al. | 438/460 |
| 2005/0009299 A1 * | 1/2005 | Wada et al. | 438/459 |
| 2006/0033678 A1 * | 2/2006 | Lubomirsky et al. | 345/32 |

* cited by examiner

Primary Examiner—Alexander G Ghyka
Assistant Examiner—Abdulfattah Mustapha
(74) Attorney, Agent, or Firm—Jingming Cai; Schein & Cai LLP

(57) ABSTRACT

A method of fabricating a semiconductor device employing electroless plating including wafer backside protection during wet processing is disclosed. The method includes the steps of laminating a wafer back side and a frame with a protective tape, applying a protective coating to a peripheral portion of the wafer and an adjoining exposed area of the protective tape, the protective coating, protective tape, and wafer forming a protected wafer assembly, curing the frame-supported protective coating, cutting the protected wafer assembly from the protective tape surrounding the protective coating, wet processing the protected wafer assembly, laminating the protected wafer assembly with a second tape, dicing the wafer, and picking up the die from the protective tape.

9 Claims, 4 Drawing Sheets

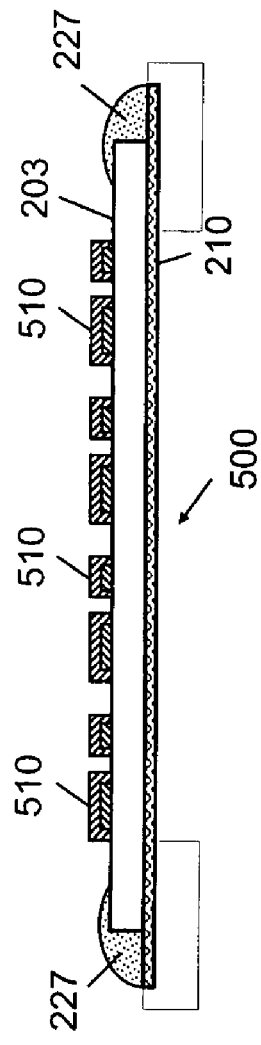
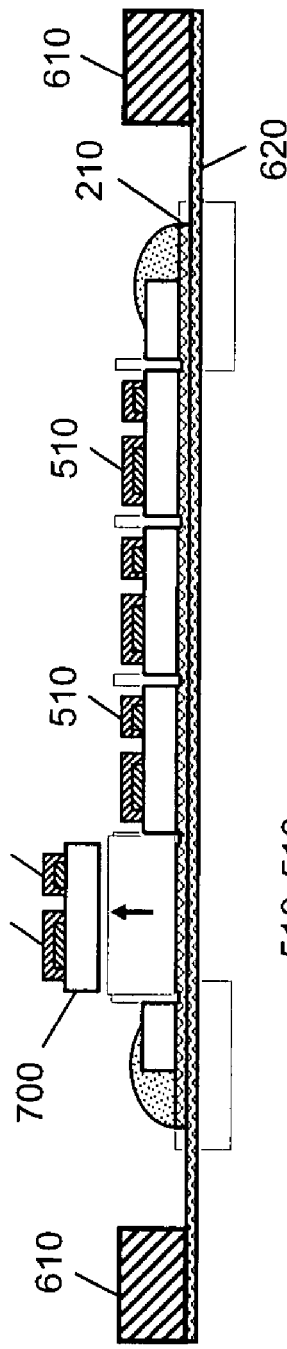
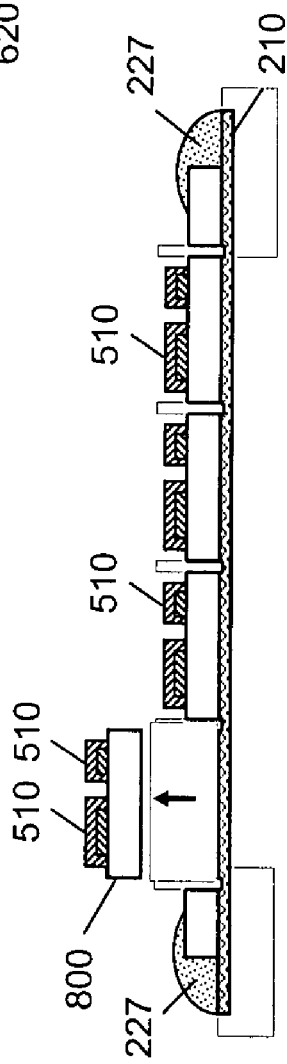
FIG. 5
FIG. 6
FIG. 7
FIG. 8

METHOD OF FABRICATING A SEMICONDUCTOR DEVICE EMPLOYING ELECTROLESS PLATING

BACKGROUND OF THE INVENTION

1. Field of the Invention

The present invention relates to a method of fabricating a semiconductor device, and more particularly to a method of protecting a wafer backside during electroless plating and dicing the plated wafer into individual dies.

2. Description of Related Art

Electroless nickel plating and immersion gold processes are widely used to deposit Ni/Au coating onto aluminum alloy pads on the front sides of wafers without the need for masks or electric plating current. It is a cost effective approach that provides a hard layer for copper wire bonding and a solder wettable layer and diffusion barrier for clip bonding and flip chip packaging.

During electroless nickel plating, the back side of a wafer needs to be covered with an insulation layer to avoid nickel plating, usually with poor adhesion, on this region. The unwanted plating consumes nickel and decreases the lifetime of the plating bath. Furthermore, if incoming wafers have metal layers such as silver on back sides thereof, corrosion of the back metal and contamination of the plating chemicals occurs. A resist layer is typically used to protect the back surface of the wafer. However, this approach necessarily involves a resist applying process and a resist stripping process. The latter process may include additional cleaning steps to remove residues of the resist. The complex process lowers production throughput and increases total cost.

In another approach, a temporary protection tape can be applied on the back side of a wafer before electroless plating. However the tape adhesive is usually poor in chemical resistance and may cause serious tape detachment problems at circumferential areas of the wafer as well as contamination of the plating chemicals. Additionally, the extra steps of tape application and removal increase cost and the chance of wafer splitting or cracking, especially for relatively thin wafers.

There is therefore a need in the art for a method of fabricating a semiconductor device employing electroless plating that overcomes the disadvantages of the prior art. The method preferably provides for a simple process with good protection, high throughput and low cost.

SUMMARY OF THE INVENTION

In accordance with one aspect of the invention, a method of fabricating a semiconductor device employing electroless plating includes the steps of laminating a wafer back side and a frame with a protective tape, applying a protective coating to a peripheral portion of the wafer and an adjoining exposed area of the protective tape, the protective coating and wafer forming a protected wafer assembly, curing the frame-supported protective coating to increase the adhesive strength of the protective coating, cutting the protected wafer assembly from the protective tape surrounding the protective coating, electroless plating the protected wafer assembly, laminating the tape side of the protected wafer assembly with a second tape, dicing the wafer into individual dies, and picking up the dies from the protective tape for die attaching.

In accordance with another aspect of the invention, a method of fabricating a semiconductor device employing electroless plating includes the steps of laminating a wafer back side and a frame with a protective tape using a UV releasing adhesive, applying a protective coating to a peripheral portion of the wafer and an adjoining exposed area of the protective tape, the protective coating and wafer forming a protected wafer assembly, curing the frame, protective tape, and protected wafer assembly to increase the adhesive strength of the protective coating, cutting the protected wafer assembly from the protective tape surrounding the protective coating, electroless plating the protected wafer assembly, loading the protected wafer assembly to a dicing equipment having a chuck holding the protective tape, dicing the protected wafer assembly into individual dies, UV irradiating the protective tape to reduce adhesion, and picking up the dies from the protective tape for die attaching.

In accordance with yet another aspect of the invention, the protective coating application step and the curing step are eliminated in the above-described methods if the adhesive layer of the protective tape can resist chemicals during wet processing. Direct wafer dicing on the protective tape is performed as described above.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 5 is a graphical representation of the protected wafer assembly of FIG. 4 after an electroless plating operation in accordance with the invention;

FIG. 6 is a graphical representation of the protected wafer assembly of FIG. 5 after lamination to another tape and frame in accordance with the invention;

FIG. 7 is a graphical representation of the laminated and diced protected wafer assembly in accordance with the invention;

FIG. 8 is a graphical representation of the diced protected wafer assembly of FIG. 5 in accordance with the invention.

DETAILED DESCRIPTION OF PREFERRED EMBODIMENTS OF THE INVENTION

Figure 1:
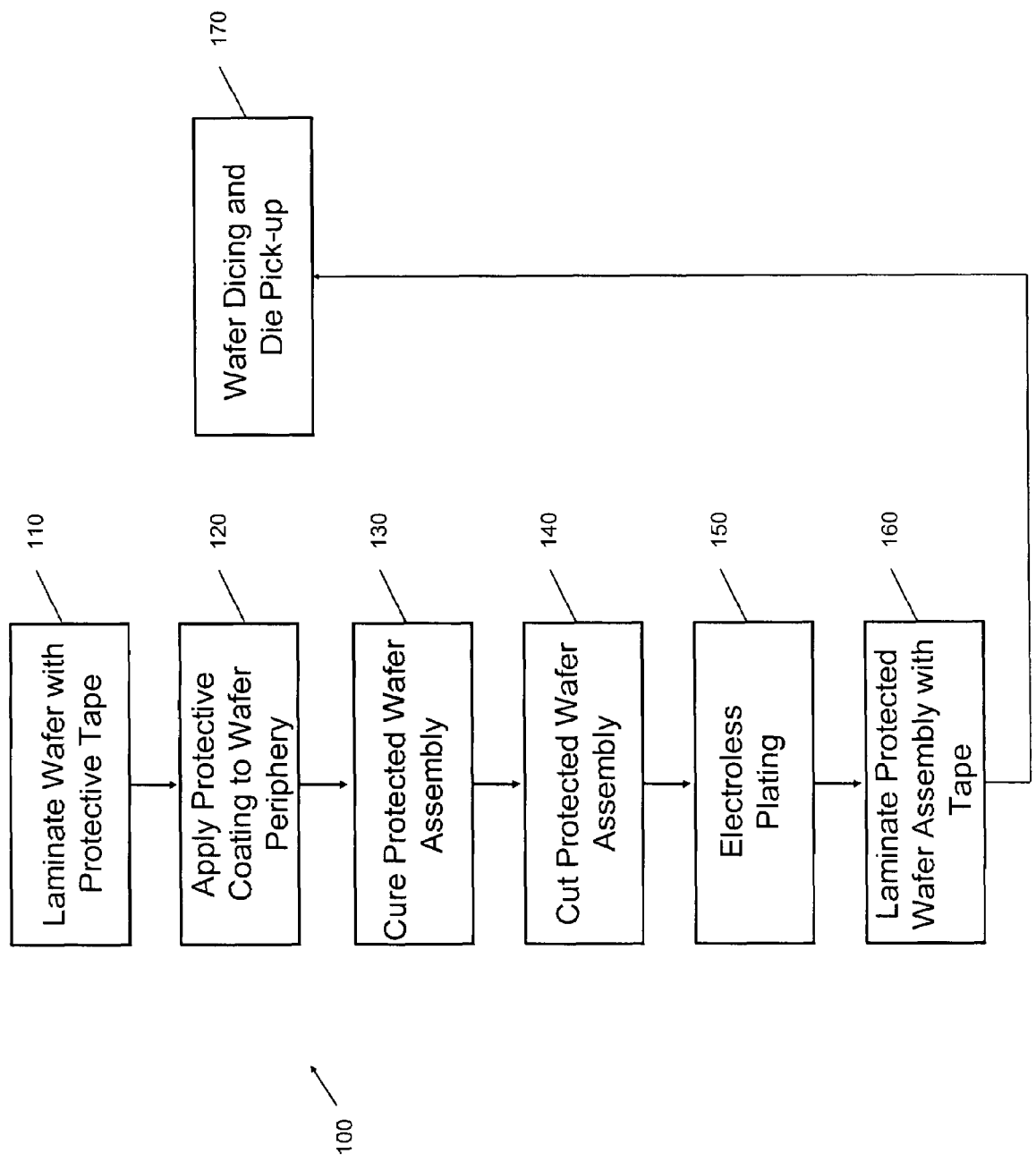
FIG. 1 is a flow chart of a method of fabricating a semiconductor device with electroless plating in accordance with the invention.
Figure 2:
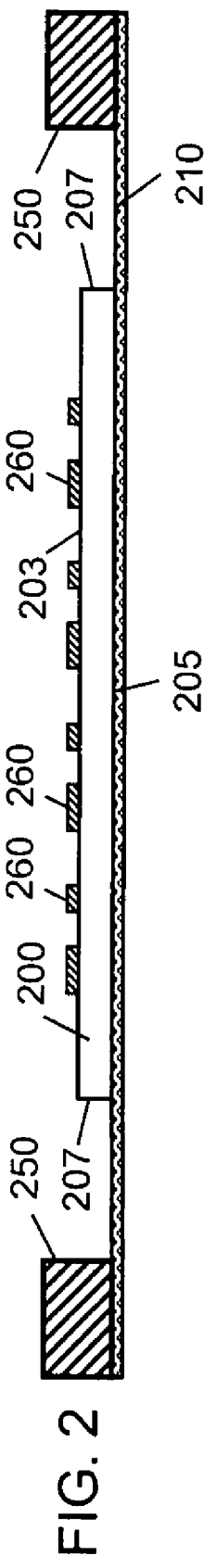
FIG. 2 is a graphical representation of a wafer attached to a protective tape and frame in accordance with the invention.
Figure 3:
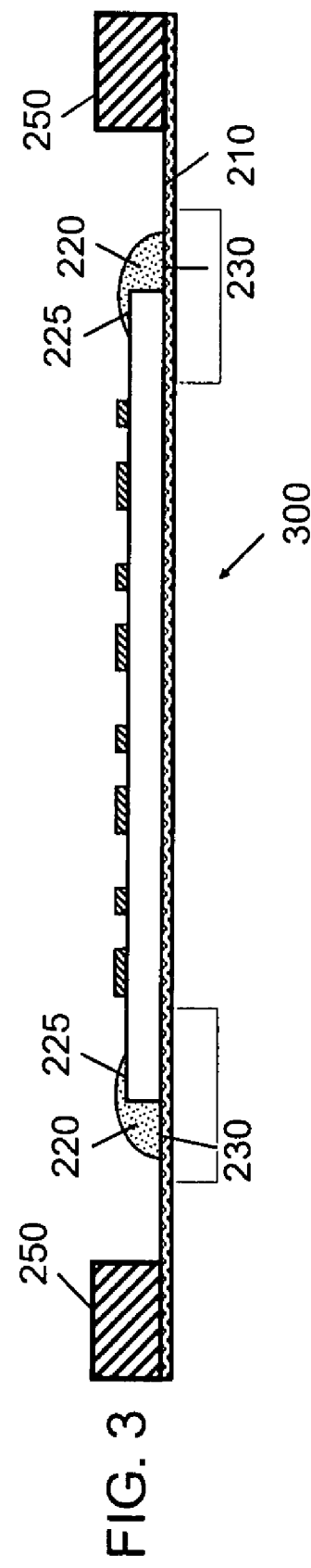
FIG. 3 is a graphical representation of the wafer of FIG. 2 covered at a periphery thereof with a protective coating in accordance with the invention.

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

The present invention provides a method of fabricating a semiconductor device with electroless plating that utilizes a protective tape for both wafer back side protection and dicing. To achieve better protection of the wafer back side in electroless plating, a wafer periphery coating is applied.

With reference to FIG. 1 through FIG. 8, a method generally designated 100 for fabricating a semiconductor device employing electroless plating includes a step 110 in which a wafer back side 205 of a wafer 200 is laminated with a protective tape 210. Protective tape 210 may include a dicing tape with chemical and high temperature resistance to the electroless plating process, for example, HTCR200-S tape available from AI Technology, Inc., of Princeton Jct., NJ.

With a frame 250 holding the protective tape 210 in place, in a step 120 a protective coating 220 is applied from a peripheral portion 225 of the wafer 200 extending about 1 to 3 mm inward from a wafer edge 207 to an exposed area 230 of the protective tape 210 extending about 2 to 6 mm from the wafer edge 207. The protective coating 220 forms a ring-shaped coating layer 227 covering the border between the wafer peripheral portion 225 and the exposed area 230 of the protective tape 210. The protective coating 220 may include a percholoroethylene and VM&P naptha composition available from Stapleton Technologies of Long Beach, Calif. under the trade name Micro 301S. Alternatively, the protective coating 220 may also include a resist that can survive in the electroless plating chemicals.

A protected wafer assembly generally designated 300 is then cured in an oven together with the frame 250 and protective tape 210 to solidify and increase the adhesion strength of the protective coating 220.

Figure 4:
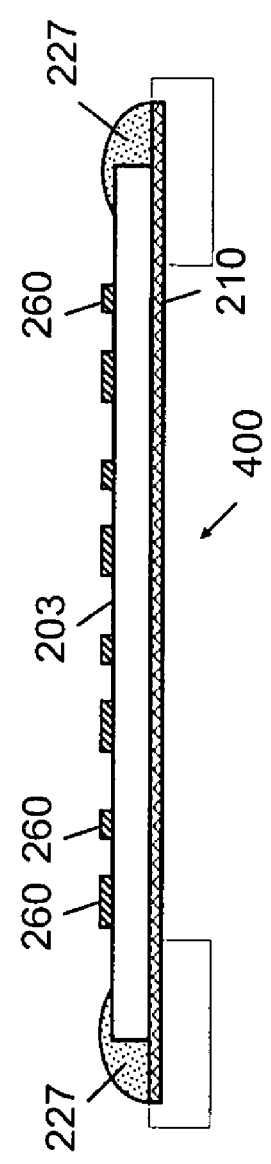
FIG. 4 is a graphical representation of a protected wafer assembly after being cut in accordance with the invention.

A ring-shaped thermocompression and cutting unit having a radius 2 to 6 mm greater than the radius of the wafer 200 (not shown) is next applied for enhanced bonding between the protective coating 220 and the protective tape 210 outside the periphery 225 of the wafer 200 and for cutting the protected wafer in a step 140. The resulting protected wafer assembly is shown in FIG. 4 and is generally designated 400.

The protected wafer assembly 400 is next electroless plated in a step 150 to form plated structures 510 on the wafer front side 203. The resulting plated protected wafer assembly is shown in FIG. 5 and is generally designated 500.

In a step 160, the assembly 500 is laminated onto a second tape 620. The tape 620 preferably has stronger adhesion than tape 210. A dicing frame 610 is used to hold the second tape 620. The resulting structure is shown in FIG. 6 and is generally designated 600.

In a step 170, the structure 600 is loaded onto a dicing equipment to divide the wafer 200 into individual dies 700, and then loaded onto a die bonding equipment to pick up the dies 700 for die attachment, which is shown in FIG. 7.

In the case where the adhesive layer of the protective tape 210 isn't adversely affected by high temperature plating chemicals and doesn't detach at the wafer periphery, steps 120, 130 and 140 as shown in FIG. 1 are skipped and step 150 performed to form plated structures 510 on the wafer front side 203.

Figure 9:
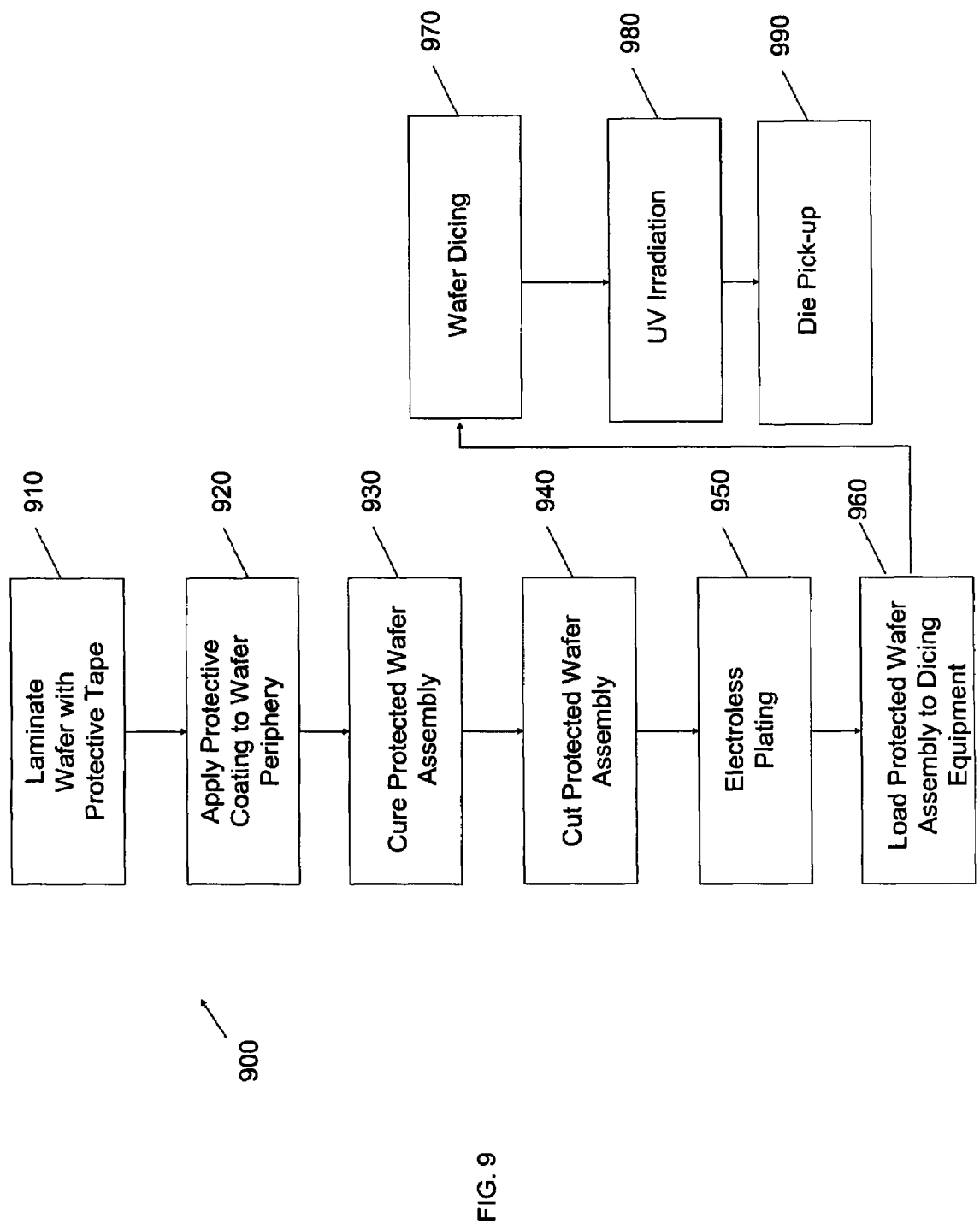
FIG. 9 is a flow chart of a method of fabricating a semiconductor device with electroless plating in accordance with another aspect of the invention.

In another embodiment of the invention, and with reference to FIG. 8 and FIG. 9, a method of fabricating a semiconductor device with electroless plating generally designated 900 includes a step 910 in which the wafer is laminated with a protective tape 210 having a UV-releasing adhesive layer. Steps 910 through 950 are identical to steps 110 through 150 of method 100 with the exception that the protective tape 210 with which the wafer is laminated has a UV-releasing adhesive layer. In a step 960, the structure 500 is loaded onto a special chuck for wafer dicing and die pick-up. The chuck is transparent to UV irradiation and can hold the protective tape 210 of the structure through vacuum or mechanical force. On the chuck, the wafer is diced into individual dies 800 in a step 970. Ultraviolet irradiation is then applied through the chuck to remove most adhesive strength of the protective tape 210 in a step 980 and the dies 800 are picked up for die attachment in a step 990.

In a case where the adhesive layer of the protective tape 210 having the UV-releasing adhesive layer isn't adversely affected by high temperature plating chemicals and doesn't detach at the wafer periphery, steps 920, 930 and 940 as shown in FIG. 9 are skipped and step 950 is performed to form plated structures 510 on the wafer front side 203.

The above methods for electroless plating and dicing achieve maximum wafer back side protection by applying both protective tape to the wafer back side as well as protective coating to the wafer/tape border. However, in other embodiments of the invention, protective coating and related steps can be eliminated if the adhesive layer of the protective tape isn't adversely affected by high temperature plating chemicals and doesn't detach at the wafer periphery.

In all of the disclosed embodiments, throughput is increased by the elimination of the protective tape and/or protective coating removal step and proceeding directly to the wafer dicing step after the wafer front side electroless plating.

While the methods of the invention have been described in terms of wafer back side protection, it will be appreciated that methods 100 and 900 may also be employed for wafer front side protection. Furthermore, methods 100 and 900 may be employed in any wet processing of the wafer.

It is apparent that the above embodiments may be altered in many ways without departing from the scope of the invention. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A method of fabricating a semiconductor device employing wet processing, the method comprising:
    (a) laminating a wafer back side with a protective tape;
    (b) wet processing a wafer front side following step (a);
    (c) laminating a second tape onto said protective tape following step (b);
    (d) dicing the wafer following step (c);
    (e) picking up the die following step (d);
    providing a frame while laminating the wafer back side with the protective tape in step (a);
    applying a protective coating to a peripheral portion of the wafer and an adjoining exposed area of the protective tape, the protective coating, the protective tape and wafer forming a protected wafer assembly;
    curing the protective coating; and
    cutting the protected wafer assembly from the protective tape surrounding the protective coating before wet processing the wafer in step (b).

2. The method of claim 1, wherein the protective coating comprises resist or a tetrachlorethylene based material.

3. The method of claim 1, wherein the peripheral portion of the wafer comprises a portion extending about 1 to 3 mm inward from a wafer edge.

4. The method of claim 1, wherein the adjoining exposed area of the protective tape extending about 2 to 6 mm from a wafer edge.

5. The method of claim 1, wherein the wet processing comprises electroless plating.

6. A method of fabricating a semiconductor device employing wet processing, the method comprising:
    (a) laminating a wafer back side with a protective tape using an ultraviolet releasing adhesive;
    (b) wet processing a wafer front side following step (a);
    (c) loading the protected wafer to a dicing equipment following step (b);
    dicing the wafer;
    (d) irradiating the wafer following step (c);
    (e) picking up the die following step (d);
    providing a frame while laminating the wafer back side with a protective tape in step (a);
    applying a protective coating to a peripheral portion of the wafer and an adjoining exposed area of the protective tape, the protective coating, the protective tape and wafer forming a protected wafer assembly;
    curing the protective coating; and
    cutting the protected wafer assembly from the protective tape surrounding the protective coating before wet processing the wafer in step (b).

7. The method of claim 6, wherein the protective coating comprises resist or a tetrachlorethylene based material.

8. The method of claim 6, wherein the peripheral portion of the wafer comprises a portion extending about 1 to 3 mm inward from a wafer edge.

9. The method of claim 6, wherein the adjoining exposed area of the protective tape extending about 2 to 6 mm from a wafer edge.

* * * * *